United States Patent [19]
Huth

[11] Patent Number: 5,146,296
[45] Date of Patent: * Sep. 8, 1992

[54] DEVICES FOR DETECTING AND/OR IMAGING SINGLE PHOTOELECTRON

[75] Inventor: Gerald C. Huth, Hermosa Beach, Calif.

[73] Assignee: Xsirius Photonics, Inc., Marina Del Rey, Calif.

[*] Notice: The portion of the term of this patent subsequent to Jun. 4, 2008 has been disclaimed.

[21] Appl. No.: 496,490

[22] Filed: Mar. 20, 1990

Related U.S. Application Data

[63] Continuation-in-part of Ser. No. 128,368, Dec. 3, 1987, abandoned.

[51] Int. Cl.$^5$ .................. H01L 31/12; H01L 29/90; H01L 27/14
[52] U.S. Cl. ........................... 357/19; 357/13; 357/30; 357/17; 313/366; 313/373; 313/354; 315/3
[58] Field of Search ............. 357/30 A, 30 D, 30 G, 357/30 H, 30 L, 30 Q, 13, 17, 19; 313/366, 373, 384; 315/3

[56] References Cited

U.S. PATENT DOCUMENTS

| | | | |
|---|---|---|---|
| 4,042,454 | 8/1977 | Haas et. al. | 357/91 |
| 4,129,878 | 12/1978 | Webb | 357/30 A |
| 4,317,091 | 2/1982 | Dahlberg | 357/13 |
| 4,383,267 | 5/1983 | Webb | 357/30 A |
| 4,403,397 | 9/1983 | Bottka et al. | 357/30 A |
| 4,458,260 | 7/1984 | McIntyre | 357/30 A |
| 4,654,678 | 3/1987 | Lightstone et al. | 357/30 A |
| 5,021,854 | 6/1991 | Huth | 357/30 A |

FOREIGN PATENT DOCUMENTS 55-44736 3/1980 Japan ..................... 357/30 A

OTHER PUBLICATIONS

Gelezunas et al, "Uniform Large-Area High Gain Silicon Avalanche Radiation Detectors from Transmutation Doped Silicon", Applied Physics Letters, vol. 30, No. 2, Jan. 15, 1977.

Primary Examiner—Andrew J. James
Assistant Examiner—Ngan V. Ngo
Attorney, Agent, or Firm—Robbins, Dalgren, Berliner and Carson

[57] ABSTRACT

A wafer of neutron transmutation doped silicon having a p-n junction between extended opposite surfaces is formed with bevelled edges. A single or plurality of reverse biased signal contacts is disposed on one surface to provide a single or integrated array of avalanche photodiodes. In addition, an avalanche photodetector (APD) capable of detecting a single photoelectron or imaging multiple photoelectrons comprises a light sensitive photocathode, similar to that in a photomultiplier tube, acting as a converter to produce photoelectrons, which are then accelerated to an anode. The anode comprises a single avalanche photodiode (AP) for detecting or an array (APA) for imaging photoelectrons. The energetic photoelectrons striking the AP or the APA serve as the AP or APA's input signal, respectively.

12 Claims, 3 Drawing Sheets

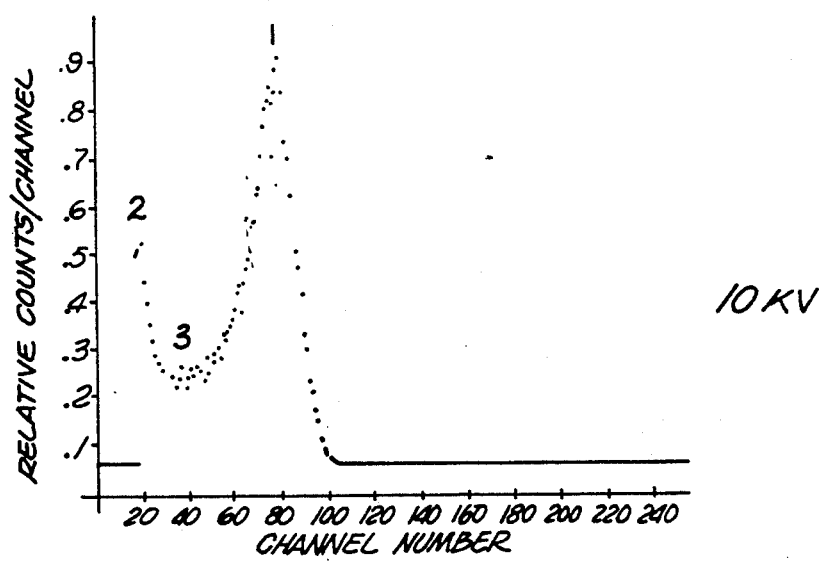
FIG. 2a  10 KV
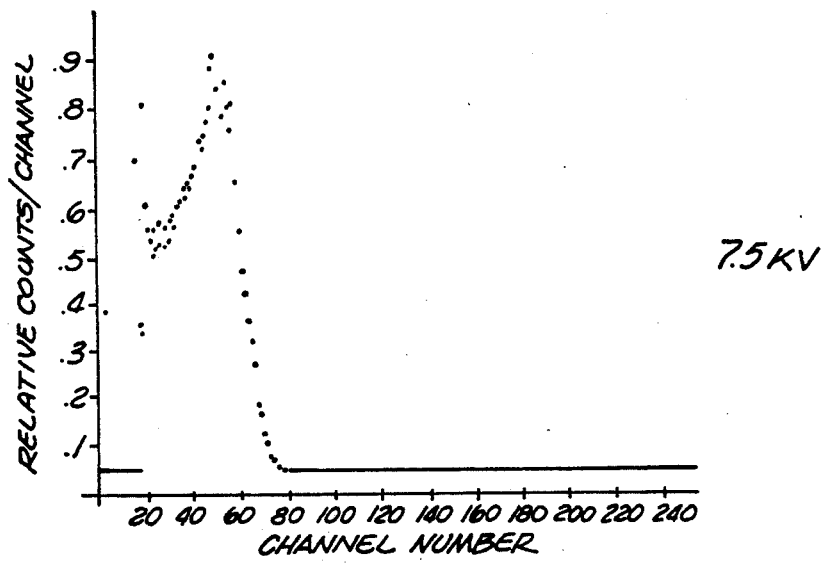
FIG. 2b  7.5 KV
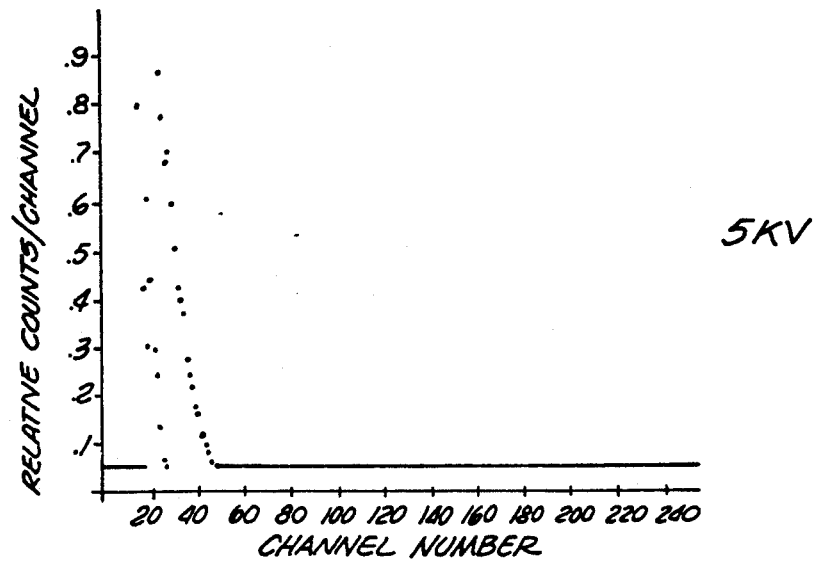
FIG. 2c  5 KV

DEVICES FOR DETECTING AND/OR IMAGING SINGLE PHOTOELECTRON

BACKGROUND OF THE INVENTION

This is a continuation-in-part application of application Ser. No. 07/128,368, filed Dec. 3, 1987 now abandoned, for "SILICON AVALANCHE PHOTODIODE ARRAY".

The present invention related to low light and very high speed detection and/or imaging of light. Particularly, the present invention relates to detectors capable of detecting single photoelectron or imaging of multiple photoelectrons comprising a light sensitive photocathode which produces photoelectrons which are then accelerated to a discrete silicon avalanche photodiode anode for detection or a silicon avalanche photodiode array anode for imaging.

Photodiodes are reverse biased to form a depleted semiconductor region with a high electric field that serves to separate photogenerated electron-hole pairs. A photodiode is operated at a reverse bias voltage that is high enough for electron avalanche multiplication to take place wherein electron-hole pairs are generated by the impact ionization process, giving rise to internal current gains. As pointed out by S. N. Sze in *Physics of Semiconductor Devices*. 2d Ed. John Wiley & Sons, 1981, pp. 766-783, incorporated herein by reference, there are a number of limitations that have been placed on such devices resulting from inherent deficiencies. For example, for high-speed operation, it is desired to keep the depletion region thin, so as to reduce transit time, but, at least for infrared or near infrared absorption, in order to increase quantum efficiency (defined as the number of electron-hole pairs generated per incident photon), the depletion layer must be sufficiently thick to allow a large fraction of the incident light to be absorbed. Sze also points out that an avalanche photodiode requires the avalanche multiplication to be spatially uniform over the entire light-sensitive area of the diode. Of most importance here are "non-uniformities" caused by resistivity fluctuations and variations. Also, microplasmas, that is, small areas in which the breakdown voltage is less than that of the junction as a whole, must be eliminated, or at least minimized by using low dislocation materials, where appropriate, and by designing the active area to be no larger than necessary to accommodate the incident light beam (generally from a few micrometers to 100 micrometers in diameter).

Excessive leakage current due to high field concentration or junction curvature at the surface is eliminated by using a surface-contoured structure. See my prior patent U. S. Pat. No. 3,293,435 entitled "Semiconductor Charged Particle Detector", and Huth et al. U.S. Pat. No. 3,449,177 entitled "Radiation Detector", describing the surface contouring of a radiation detector, as well as Huth et al. U.S. Pat. No. 3,491,272 entitled "Semiconductor Devices With Increased Voltage Breakdown Characteristics" and Huth et al. U.S. Pat. No. 3,575,644 entitled "Semiconductor Device With Double Positive Bevel", describing the beneficial effects of a positive bevel on the voltage breakdown characteristics of such devices as rectifiers. The teaching of U.S. Pat. No. 3,293,435, 3,449,177, 3,491,272 and 3,575,644 are incorporated herein by reference. In recent years, high power, high voltage thyristors (typically multilayered p-n-p-n devices) have been constructed that not only use bevelled surfaces to maximize the breakdown voltage, but that also use highly uniform n-type silicon obtained by a neutron transmutation doping process. See, in this regard, the discussion in Sze, suora, pp. 190-209.

Large area avalanche devices have been virtually impossible to construct because of what has been referred to as a base resistivity striation problem. As the silicon ingot is grown, dopant segregates in ridges at the growth interface, but not uniformly since the interface is a meniscus, giving rise to a resistivity fluctuation that can be as great as plus or minus 15-20%. The result is a "corrugated" electric field in the junction which prematurely breaks down at its weakest level and limits avalanche gains to about 50 to 100. As a result, avalanche devices have not been able to compete with or supplant image tubes where large area photoresponse is required. Currently, there are a number of optical tracking and guidance detectors that are capable of sensing extremely low levels of light (to the region of a few photons) and the direction of such a low intensity light source. These include the "Digicon" and the "multichannel plate photomultiplier" (MCP).

Digicons (meaning digital image) are image tubes that make use of semiconductor electron detecting arrays to detect photoelectron images from a photocathode. Since the diode arrays themselves provide no gain, all the gain must be obtained by accelerating the photoelectrons under very high operating voltages, generally 15,000 to 30,000 volts. Such devices have the ability to detect even a single photoelectron but, because of the high voltage requirements, they have significant limitations in dynamic range, useful life, ease of manufacture and mechanical ruggedness, which severely limit their applications. Not only are such devices subject to problems such as arcing from the high acceleration potential, but radiation damage is so severe that spatial resolution degrades with time. This results in a drastic limitation of the number of photons that can be permitted to be incident, limiting such devices to astronomy applications and related uses.

Another type of device that uses an array is a charged coupled device, basically an array of closely spaced metal-oxide-semiconductor ("MOS") diodes in which information represented by charge packets is serially transferred across a semiconductor substrate under the application of a sequence of clock voltage pulses. Such devices operate with no internal gain, although "on-chip" low noise FETs provide some amplification of the signal.

The multichannel plate photomultipliers are fabricated using a vacuum/photocathode assembly and high voltage acceleration of the photoelectrons into an array of microchannels in a channel plate. An electric field across the MCP and secondary electron emission within the MCP provides photomultiplier-like amplification. Hartel disclosed two types of commercially available multichannel optical detectorp13 the image intensified, self scanned array (ISSA) and the position sensing photomultiplier (PSP) which can detect, locate and integrate individual photon events using MCP to create images from low light level inputs (Hartel, R.J., "Creating multi-channel images by locating photon events", presented at the Sixth International Congress on Application of Lasers and Electro-Optics, San Diego, CA 8-12, Nov. 1987). As unique as the MCP photomultipliers are, they have severe limitations in the areas of sensitivity, resolution, dynamic range, useful life, ease of manufacture, and mechanical ruggedness which severely limit their applications.

Table 1 below summarizes the performance comparison of the APD with the MCP and the Digicon. It is clear from Table 1 that the APD of the present invention outperforms the MCP and the Digicon in terms of energy resolution for single photoelectron, gain linearity, count rate capability, roughness, producibility, useful life and potential for single photon imaging.

reverse voltage occurs within the bulk of the semiconductor material instead of at the surface. The discrete photodiode or photodiode array is defined by signal contacts disposed on one surface, which can take the form of non-injecting n+ or p+ contacts. In one embodiment of the array, the signals are taken out in parallel.

The invention is unique in the formation of a discrete or an array of avalanche photodiodes. The entrance

TABLE 1

| Description | SILICON AVALANCHE HYBRID PHOTODETECTOR VAC. PHOTOSURFACE + SINGLE STAGE SILICON AVALANCHE ELECTRON AMPLIFIER | MCP PHOTO-MULTIPLIER TUBE VAC. PHOTOSURFACE + 1-2 STAGES OF MICROCHANNEL PLATE ELECTRON AMPLIFICATION | DIGICON VAC. PHOTOSURFACE + UNITY GAIN SILICON IMAGING DEVICE (CCD) |
|---|---|---|---|
| 1. Single electron response | Yes - clean | Yes - but unstable | Yes - with 15-30 kV electron acceleration |
| 2. Timing (FVHM) | 250 ps | <200 ps | N/A |
| 3. Energy resolution for single photoelectrons | 30% | 100-150% | |
| | 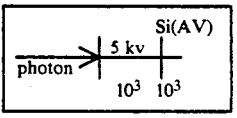 | 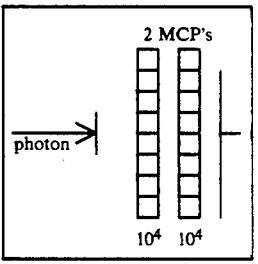 | 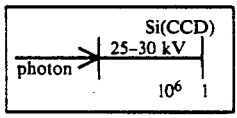 |
| 4. Gain linearity | up to $10^{16}$ c cm$^{-2}$ s$^{-1}$ | up to $2 \times 10^{11}$ c cm$^{-2}$ s$^{-1}$ | $5 \times 10^3$-$10^4$ |
| 5. Count rate capability | $10^9$ P/S | $10^5$ P/S | $10$-$10^4$ P/S |
| 6. Temperature behavior | sensitive/ negative coeff. | good (−80 to + 50 C.) | ? |
| 7. Robustness Producibility Useful life | excellent long | fragile short | $10^{12}$ counts/diode image element |
| 8. Potential for low light level (single photon) imaging | best - perhaps unique smallest pixel dimension | crude | severely limited to low light level conditions by radiation damage in the silicon device |
| 9. Susceptability to magnetic fields | susceptible | susceptible | probably not important |

SUMMARY OF THE INVENTION

The present invention overcomes the drawbacks referred to above by providing a discrete silicon avalanche photodiode anode or a silicon avalanche photodiode array of extended and incomparable area and having unprecedented avalanche gain values. Specifically, a single avalanche photoanode or an integrated array of avalanche photodiodes is provided on a single wafer. This is made possible by a synergistic combination of physical features not heretofore combined. A body of neutron transmutation doped ("NTD") silicon, for example in the form of a wafer, having a p-n junction between extended opposite surfaces, has its edge surfaces contoured, more specifically bevelled. A single or plurality of reverse biased signal contact(s) is disposed on one surface to provide a single discrete or an integrated array of avalanche photodiodes. The invention is embodied in a number of forms and takes on a number of implementations. In general, however, all embodiments require the uniform resistivity obtained by NTD n-type silicon and surface contouring or bevelling of the edges of the device so that any breakdown due to surface of the device can be treated, for example, to enhance photosensitization in the visible or ultraviolet wavelength region. A pixel plane is thus made adjacent to an avalanche section defining a "gain plane" of about 1,000. The lateral avalanche effect is no longer limited to the millimeter range, but can extend over the entire active region of a silicon wafer from 3 to 7 centimeters in diameter or more. Radiation damage is minimized by the high avalanche electric field. In the array embodiments, non-injecting contacts can be defined by n+ regions that are diffused or ion implanted into the NTD n-type semiconductor material, so that a tremendous number of array elements can be formed on the device, essentially limited only by the ability to devise methods to read out signals and by possible sub-micron fluctuations in the NTD-produced phosphorus dopant.

In one form of the invention, a high-density, fine array is provided defined by signal contacts along the relatively flat top surface of the wafer, the edge of the wafer being surface contoured.

In the present invention, optical detectors that will significantly reduce and/or eliminate these limitations while maintaining single photoelectron detection and tracking capabilities are provided.

The new device is provided with a light sensitive photocathode, similar to that in a photomultiplier tube, acting as a converter to produce photoelectrons, which are then accelerated to an anode. The anode is a silicon avalanche photodiode or a photodiode array (APA), and the energetic photoelectrons striking the photodiode or the APA serve as the photodiode or APA input signal. The photodiode or APA possesses internal gain values of from $8 \times 10^2$ to $10^3$, eliminating the need for high photoelectron acceleration voltages. Its greatly amplified output signal then becomes the output signal of the device.

In effect, the device combines the best features of the photomultiplier tube with those of photodiode or APA technology, and is capable of achieving many parameters not available in conventional PMTs. It is capable of sensing extremely low levels of light at room temperature (down to single electron detection); its APD has large (to inches) sensitive areas, uniform gains to 10 or more, high signal to noise ratio; adjustable wavelength response, relative insensitivity to magnetic fields, and a construction more compact and rugged than that of conventional PMTs. The device also operates at extremely high speeds.

Additionally, the avalanche technology permits operation at greatly reduced voltage, thereby: 1) reducing or eliminating the severe problems associated with corona discharges, 2) decreasing the radiation damage caused by the high energy electrons when they strike the APD, thus extending the hybrid detector's lifetime, 3) allowing for ultimate miniaturization of the device and 4) reducing the cost of the device.

In another embodiment, a "coarse" array is provided in which individual array elements are isolated by a gridwork of bevelled edges cut through the wafer, for example with a diamond wheel. Such coarse arrays can be particularly useful in the formation of what are known as "quadrature arrays", useful in optical guidance systems, although quadrature arrays can also be constructed of the high-density array elements. The silicon avalanche high density photodiode array is connected to act in conjunction with a photo multiplier to form a hybrid, part solid state, Digicon.

The novel features which are believed to be characteristic of the invention are set forth with particularity in the appended claims. The invention itself, however, both as to its organization and method of operation, may best be understood by reference to the following description taken in connection with the accompanying drawings.

BRIEF DESCRIPTION OF THE DRAWING FIGURES

FIG. 1 is a schematic, cross-sectional view of a silicon avalanche high-density photoanode constructed in accordance with one embodiment of the present invention for the detection of single photoelectrons;

FIGS. 2a-c illustrates the response of a discrete avalanche hybrid single electron detection device at various acceleration voltages;

DETAILED DESCRIPTION

Figure 1:
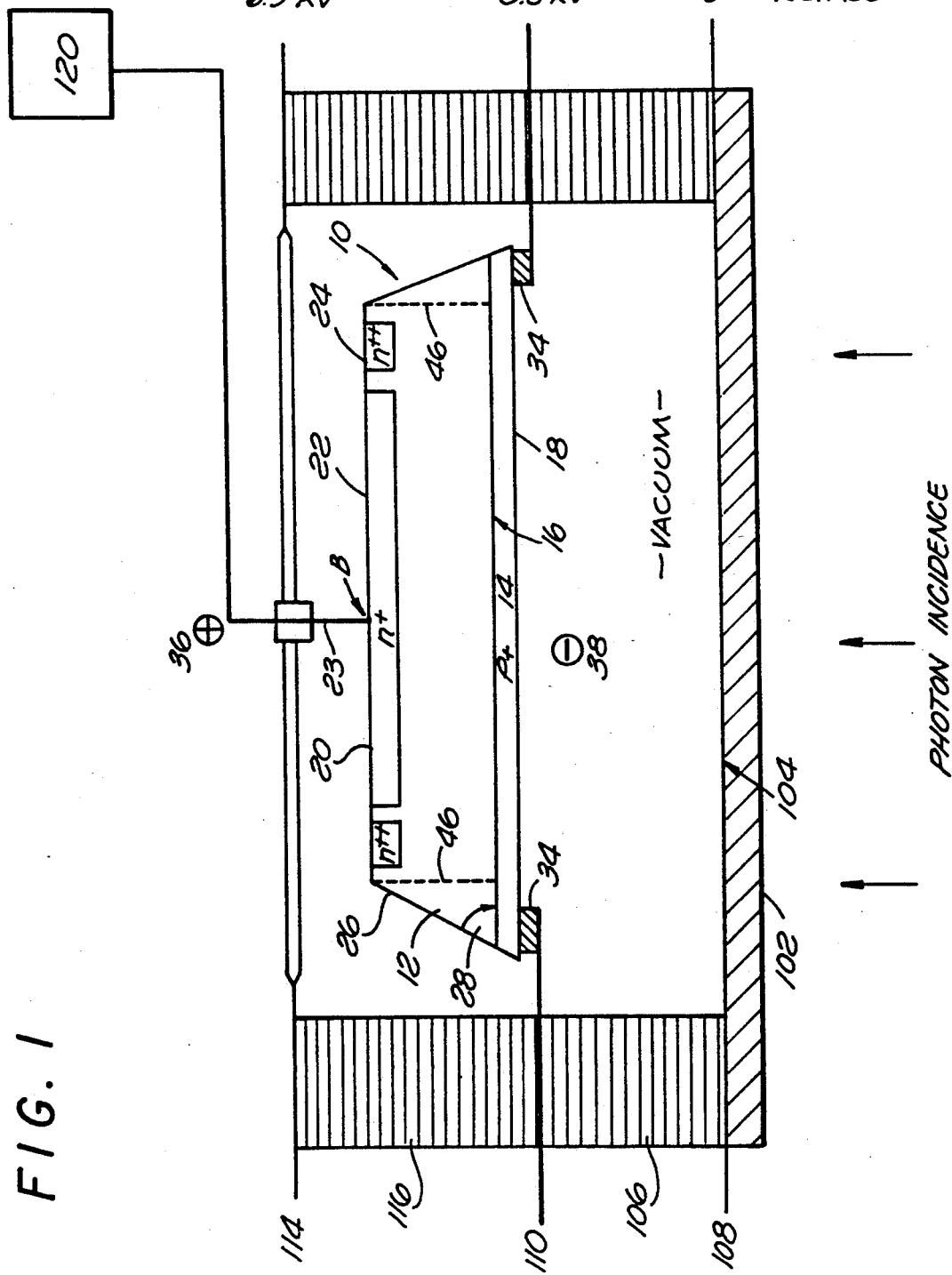

FIG. 1 illustrates a single photoelectron detection device providing with an avalanche photodiode formed of a wafer 12 of NTD n-type silicon, about 7-10 centimeters in diameter. The process for providing NTD silicon is well-established. See in this regard the "Special Issue on High-Power Semiconductor Devices", i.e., Trans. Electron Devices, ED 23 (1976), in particular the article therein by E. W. Haas and M. S. Schnoller, "Phosphorus Doping of Silicon by Means of Neutron Irradiation", at 803 (1976), incorporated herein by reference. A silicon slice having high resistivity is irradiated with thermal neutrons. The process gives rise to fractional transmutation of silicon into phosphorus and dopes the silicon n-type as follows:

$$Si^{31}O_5 + neutron \rightarrow Si^{31}{}_{14} + \gamma ray + p^{31}{}_{15} + \beta \text{ ray}$$

with a half life of 2.6 hours. Since the penetration range of neutrons in silicon is about a meter, doping is very uniform throughout the slice. For example, resistivity variations are about plus or minus 15% for conventionally doped silicon and about plus or minus 0.5% for NTD silicon.

As a result of the neutron transmutation doping process, the silicon wafer 12 has phosphorous impurities very uniformly distributed throughout its bulk. Typically, there are $10^{14}$ to $10^{15}$ phosphorous atoms/cm$^3$ forming an n-type silicon having a resistivity of about 30–50 ohm-cm. The lower region of the wafer is formed with a p+ layer 14 defining a p-n junction 16 coplanar with the parallel surfaces of the wafer 12. For example, the p+ region can be made by diffusing boron or gallium from a gas into the lower surface of the wafer 12 by techniques which are well known. The p-type impurities are deep-diffused into the surface and a portion is removed from the deeply diffused region in accordance with the teachings of Huth et al. U.S. Pat. No. 3,449,177. For example, by diffusing boron into the crystal to form a gradient 75 microns deep, and then lapping 20–30 microns, and etching 1–0.5 micron, a flat, polished, major entrance surface 18 is produced in which the p+ region is about 100 microns deep and the p-n junction 16 is about 25 microns thick.

A non-injecting contact 20 is formed by diffusion of additional n-type impurity, such as antimony, into the top major surface 22 of the wafer, for example, by use of the well-known planar process or by well known ion implantation processes. The element 20 constitutes a circular region of n+type silicon. In similar manner, a guard electrode 24 of n++type silicon can be formed by diffusion of an impurity such as phosphorus in a ring around the element 20. The provision of the guard electrode 24 is of course a well known expedient. It is deeper than element 20 and can be formed prior to and/or during formation of the guard element 24.

In the embodiment of FIG. 1, electrical lead wire 23 is connected to element 20, for example by thermal compression bonding with a gold silicon alloy, or with pure gold wire. Alternatively, the contacts can themselves form the element 20 by using a gold-antimony alloy, for example with about 0.1% antimony, to simultaneously form the heavily doped n+ type region. All of these techniques are well known to the art and do not themselves form a part of the invention.

The photodiode of FIG. 1, (as with all the embodiments) is reverse biased to provide an avalanche photodiode. The breakdown voltage of such an avalanche device is determined by a number of factors, including the depth of the p-n junction, and the resistivity of the material. In a typical embodiment, the bulk breakdown voltage is in the range from about 1500 to 200 volts. Premature breakdown along the edge surfaces of the device is eliminated by using surface contouring, a technique described in Huth et al. U.S. Pat. No. 3,491,272. Such surface contouring is effected in the embodiment of FIG. 1 by bevelling the edges of the wafer 12 using simple cutting and lapping techniques (See, for example, Huth et al. U.S. Pat. No. 3,491,272.) so as to form a positive bevelled structure, i.e., one in which the cross-sectional area of the wafer 10 decreases from the heavily doped side of the p-n junction 16 (p+region 14) to the more lightly doped side (n-type region). In particular, the edge surfaces 26 are bevelled so that the angle 28 formed with the plane of the p-n junction 16 and the major faces 18 and 22 of the wafer 10, is about 10 degrees. A range from about 5 degrees to about 40 degrees is generally useful. The drawing of FIG. 1 is, of course, not to scale.

The positive bevelled contour 26 is illustrative of bevels that may be used. The straight bevel shown is a practical contour and can be readily obtained by simple cutting and lapping techniques. However, more complex contour surfaces related to the shape of the electric field are within the scope of construction of the device of FIG. 1. By providing a contoured surface 26, the device is made bulk limited rather than surface limited. In other words, the peak reverse voltage is limited by the voltage at which avalanche breakdown occurs in the interior of the semiconductor wafer body, rather than being limited by the peak surface electric field.

The entrance surface 18 of the wafer can further include a thin, (0.1-0.3 micron deep) p++ blue enhanced photosensitizing layer diffused into the p+ layer 14. This minimizes any "dead layer" to increase UV response to the 200-300 nm level. Technology for producing even thinner dead layers on silicon for far UV detection are known. For example a technique known as the "Flash Gate" method comprises applying an extremely thin silicon layer covered with a 10 angstrom thick metallic platinum layer to produce response in the 100 nm region. Such a technique has been applied to charge-coupled 2-dimensional imaging devices for broad wavelength response application. With the avalanche techniques of the present invention, response is possible for even single photons at energies approaching 100 eV, or into the "vacuum UV" region. An additional antireflective coating, for example formed of silicon oxide, is applied to the p++ layer.

A front contact ring 34, formed of gold or even conductive epoxy resin, is bonded to the lower surface 18 of the device and acts in conjunction with the lead 23 from the non-injecting contacts 20 and an applied potential of 1500-2300 volts, having positive and negative polarities 36 and 38, respectively, to create a reverse bias voltage high enough for avalanche multiplication to take place. The result is a deep diffused avalanche junction and a depletion region, i.e., an avalanche space charge region, that spans the p-n junction 16, extending from the avalanche junction to the top surface 22 of the wafer 12. A carrier drift region, about 10-25 microns deep, extends from the photosensitizing layer to the avalanche junction and constitutes a pixel plane. The space charge, or avalanche, region therefore constitutes a gain plane immediately adjacent the pixel plane.

As indicated in FIG. 1 by the dashed lines 46, the regions of the wafer 12 below the bevelled edge 26 are inactive, the active portion of the device being confined to those regions in line with the element 20.

Referring to FIG. 1, in essence, the single electron detection device utilizes "hybrid" photomultiplication, that is, a "Digicon" type image tube in which an avalanche photodiode replaces the no-gain diode normally used in such devices. Photodetectors of the Digicon type are fabricated using a traditional vacuum/photocathode assembly. High voltage accelerates generated photoelectrons into a silicon diode. Essentially the device is analogous to an imaging photomultiplier tube using an ordinary photocathode as a photon/electron converter on one end and a silicon semiconductor photodiode on the other end. The device provides for single photoelectron counting capability by applying a voltage of 15-30 kilovolts between the photocathode and the silicon diode, achieving an electron gain of from $5 \times 10^3$ to $10^4$. Dynamic range is a serious limitation in Digicon type devices with limits set by the noise background (i.e., counts detected by the diode with no optical signal incident) of about 10 counts per second to a maximum count rate of about $10^4$ counts per second. The upper limit is set by the slow collection time of the diode used thus far, which is an ordinary, non-amplifying silicon photodiode, and the necessarily slow, charge sensitive electronic preamplification that must therefore be used. Radiation damage in the silicon diode caused by the interaction of the electrons accelerated by these very high voltages is a serious problem and one which limits the life of the detector, currently to only about $10^{12}$ counts per diode image element.

For example, with a Digicon, in order to generate a measurable signal from an initial single photoelectron (from an optical photon interaction), the detector employs an acceleration voltage of 20-30 kilovolts within its enclosed vacuum. The signal generated is calculated in electron-hole pairs by dividing the voltage by approximately 3 eV/electron-hole pair. Therefore, under an acceleration of say 20 kilovolts, about 5500 electron-hole pairs are generated. Such a signal level is at just about the noise limit of a room temperature operated diode with associated charge sensitive preamplification electronics. Voltages greater than 20 kilovolts are often employed to get useful signal levels from the detector. While the Digicon is an extraordinary device, with a tremendous optical detection capability, elaborate components are needed to provide magnetic focusing and deflection and it has all the limitations that have been previously referred to herein, attributable to the requirement that very high voltage levels be used.

Because of the multiplication obtained by the avalanche photodiode of the present invention, a hybrid, Digicon-type device can be constructed which obtains an equivalent generation of electron-hole pairs but at only a fraction of the voltage, i.e., about 3-5 kilovolts.

Alternatively, the hybrid device can maintain the detector voltage at the 20 kilovolt level with the resultant signal level being as high as $5.5 \times 10^6$ electron-hole pairs. Such a large output signal can have many ramifications, among which are a general simplification of associated electronics. Noise in the low level output of non-gain diodes effectively "smears out" resolution between diode elements and is a limiting factor. For example, at the 20-kilovolt range, the magnitude of the scattering distance of electrons in a silicon diode becomes about 25–50 micrometers, which is close to the measured resolving power of the Digicon detector. Since the signal level determines the ultimate spatial resolving power in high density arrays, the spatial resolving power of the device can be raised by this invention to a few micrometers from the current 20–100 micrometer level.

Referring more specifically to FIG. 1, the hybrid, Digicon-type device of this invention includes on the "Digicon side" a flat, optical glass face plate 102, carrying on its top surface a photocathode layer 104, separated, but closely spaced from, the entrance surface 18 of the avalanche photodiode by means of a ceramic insulator ring 106. High voltage electrode rings 108 and 110 are disposed respectively between the photocathode surface 104 and insulator ring 106 and between the insulator ring 106 and entrance surface 18 of the avalanche photodiode array wafer 12. The distance obtained between the photocathode surface 104 and the entrance surface 18 of the avalanche wafer 12, for example, about a millimeter is sufficiently small to enable simple proximity focussing.

A third high voltage electrode ring 114 is disposed to contact the top surface 22 of the avalanche photodiode wafer 12 and is supported on and spaced from the middle high voltage electrode 110 by means of a ceramic insulator ring 116. Leads 23 from element 20 is connected at the center B to pulse detection electronics 120 which includes amplifiers, discriminators, counters, etc., all as known in the Digicon art. The nature of the optical glass 102 and associated photocathode surface 104, method of association, and the photodetection electronics, are well known to the art and do not themselves form a part of the invention.

The composite, hybrid structure is clamped or otherwise secured and, during construction, a vacuum is applied so that there is a vacuum between the photocathode surface 104 and avalanche wafer entrance surface 18.

"Dead layer" considerations at the front surface of the avalanche photodiode require that the input electron be accelerated so as to have a range in silicon of about 1 micrometer, requiring a voltage range of about 3–5 kilovolts. In this regard, as previously indicated, "Flash Gate" technology has been developed to provide high quantum efficiencies in the visible and extended blue regions of the optical spectrum wherein photoabsorption is of the same depth of a micrometer, or less.

As indicated in FIG. 1, in an exemplary embodiment, a voltage of 5 KV is applied across the lower high voltage electrode rings 108 and 110 to accelerate electrons from the photocathode surface 104, providing as a result of that acceleration, about $1.4 \times 10^3$ electron-hole pairs. A voltage of 6.5 KV is applied to the top high voltage electrode 114 with respect to the bottommost electrode 10B, resulting in an internal avalanche gain of about $10^3$, for a total gain of approximately $1.4 \times 10^6$.

FIGS. 2a–c summarize the response of a discrete avalanche hybrid single electron device at 5, 7.5 and 10 kV electron acceleration voltages, respectively. The responses are measured with a discrete silicon avalanche photodetector. Photoelectrons are accelerated onto the discrete avalanche detector using proximity focusing at the acceleration voltages. Upon impact, electron-hole pairs are generated, one electron-hole pair is produced for each 3.6 eV of energy lost by the photoelectron in the diode. Each current pulse generated by a photoelectron is amplified by a charge-sensitive preamplifier and is counted in a digital sense or a photoelectron event if it exceeds a preset discriminator threshold level. A "pulse-height distribution" is formed by converting the photoelectron pulse after amplification into an analog voltage by an analog-to-digital converter (ADC). The output of the ADC provides a numerical representation of the height (or magnitude) of the photoelectron pulse. The digital pulse-height representations of all the pulses are then sorted by magnitude into different channels and the number of counts (photoelectrons) is then plotted as a function of channel number.

As shown in FIGS. 2a–c, the pulse-height distribution for the discrete silicon avalanche photodetector at various photoelectron acceleration voltages are characterized by three major regions, viz. the single electron peak 1, the low energy electronic noise portion 2 and the valley 3 therebetween where the discriminator level is set.

The single electron peak 1, which represents incident electrons that release their full energy within the avalanche photodiode, is shifted towards higher channel numbers in FIGS. 2a–c as the photoelectron acceleration voltage increases from 5 to 10kV. Counts occurring between the electronic noise distribution and the single electron peak caused by incident electrons falling on the avalanche photodiode peripheries and by electron back scatter from the avalanche photodiode also increase as the photoelectron acceleration voltage increases from 5 to 10 kV. In both situations, only a portion of the incident electron's energy is collected by the avalanche photodiode and is manifested as a lower-magnitude pulse-peak value.

Figure 3:
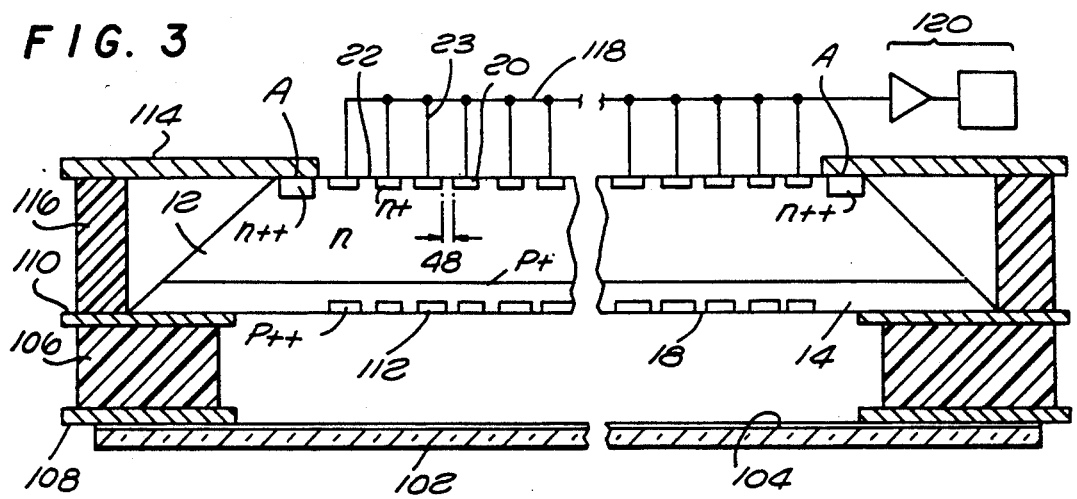
FIG. 3 is a schematic cross-sectional view of a silicon avalanche high-density photodiode array connected to act in conjunction with a photomultiplier to form a hybrid, part solid state, Digicon, in accordance with another embodiment of this invention.

Referring to FIG. 3, a device utilizing hybrid photomultiplication, in essence a "Digicon" type image tube, in which an avalanche photodiode array 10 (APA) is used to replace the no-gain diode array normally used in such devices. The APA is similar to the discrete avalanche photodiode except with a plurality of non-injecting contacts 20 on the top region surface 22 of the wafer. The photolithographic technique used with such processes permit a very large number of signal contacts 20 to be arranged as an array on the top surface 20 of the wafer, each signal contact defining an array element and electrical lead wires 23 and connected to each individual array element 20.

The result is an array with the capability of massive parallel readout. In this regard, reference can be made to the article "Digicons in Space" in the Sept., 1980 issue of Electro-Optical Systems Design, pp. 29–37, incorporated herein by reference, where there is described an image tube, referred to as a Digicon using a diode array of 512 elements. The embodiment of FIG. 3, in which 512 array elements are formed through the top surface of the wafer 12, can readily substitute for that diode array, as will be described in more detail below.

The simple nature of the wafer structure used in the embodiment of FIG. 3 and the extremely high uniformity obtained by the NTD process, permits the formation of a diode array that is limited only by photolithographic techniques and the ability to physically arrange for the parallel disposition of individual output contact wires 23.

Similar to the discrete device, a carrier drift region about 10-25 microns deep extends from the photosensitizing layer to the avalanche junction constitutes a pixel plane. The size of the pixels in the pixel plane is defined by the minimum distance 48 between the array elements, which, in turn, is determined by the resolution obtained by the diffusion or ion implantation step used to form the elements 20 as well as the avalanche spreading factor. As a result, devices can be constructed having pixel dimensions smaller than the 100 $\mu$m value which is about the practical limit of charge coupled device technology.

The angular spatial resolution is a function of a number of factors such as the number and spacing of the silicon diodes (currently the smallest spacing being on 100 micrometer centers) and the high voltage applied to accelerate the photoelectrons into the silicon array.

Furthermore, the APA wafer 12 is as described similar to FIG. 1. The avalanche photodiode array wafer 12 is as described with respect to FIG. 1, except that a plurality of p++ regions 112 may be formed, e.g., by diffusion or ion implantation of boron, into the p+ region 14. The p++ regions 112 serve as "acceptors" for electrons accelerated from the photocathode layer. The p++ regions 112 can be as numerous as the n+ array element 20 to maintain spatial resolution, but mutual alignment between the p++ regions 112 and array elements 20 is not required. Leads 23 from the array elements 20 are connected to a bus 118 which, in turn, is connected to pulse detection electronics 120.

Figure 4:
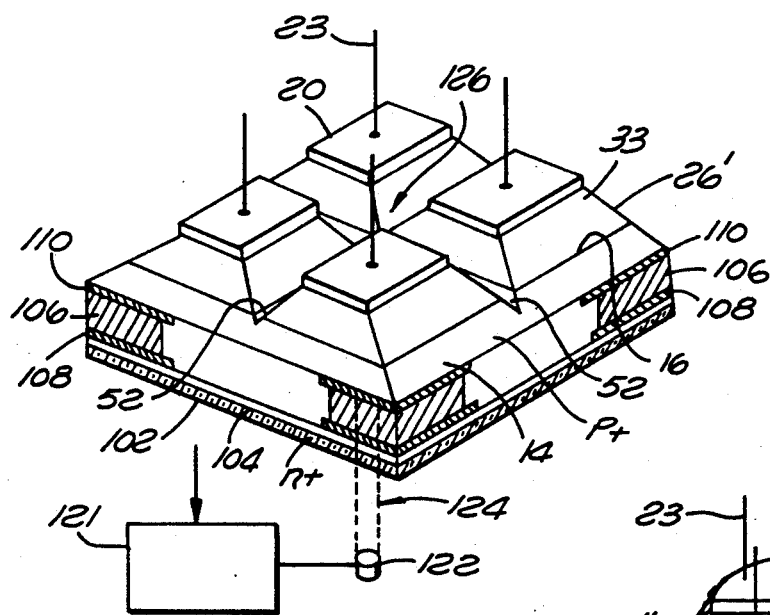
FIG. 4 is a schematic, perspective view of a quadrature array formed from four silicon avalanche low-density photodiodes connected to act in conjunction with a photomultiplier to form a hybrid, part solid state, Digicon, in accordance with another embodiment of the present invention.

Referring to FIG. 4, a particular application of a coarse array structure is illustrated, obtained by separating four of the isolated coarse array diodes 33 integrally disposed in quadrature array. Here also, a wafer 12 of NTD n-type silicon is the starting material in which there is provided a p+region 14 by techniques identical to that referred to above with respect to the embodiment of FIGS. 1 and 3. Other aspects of the embodiments of FIGS. 1 and 3 are applicable here, for example, the provision of a photosensitizing layer 30 and antireflective coating, but which for simplicity are not illustrated. The major difference between the coarse array of FIG. 4 and the denser array of FIGS. 1 and 3 is the isolation of individual photodiodes 33 by the application of a gridwork of bevelled edges 26' which are similar to the outer edge bevel 26 and in which the angle formed with p-n junction 16 is also the same. In particular, array elements 20 along with associated leads 23 are formed in the manner referred to with respect to FIG. 3, but they are less closely packed. The wafer is cut through in a gridded pattern by means of a diamond wheel, or other cutting device, to form the positive bevels 26'. The bevelling of the wafer 12 is conducted so as to just cut through the p-n junction 16, thereby isolating each of the photodiodes 33 defined by the contacts 20. A plurality of junctures 52 are formed criss-crossing the wafer, isolating the individual diodes 33. With each photodiode 33, there is an active region 54 directly beneath the contact 20, delineated in the drawing of FIG. 3 by the dashed lines 46 adjacent the outer edge and internally by the dashed lines 56. Details of the entrance surface 18 of the coarse array device of FIG. 4 are the same as depicted in FIG. 3. The electrical leads 23 from each n+ region 20 are connected to a feedback mechanism 121 which in turn is connected to an imaging system including a lens or semiconductor laser 122. The feedback mechanism and method of connection, and the imaging system and lens or laser 122 are all in accordance with techniques that are well known to the art and do not themselves form a part of the invention.

Analogous to the hybrid part solid state Digicon device in FIG. 3, the quadrature device uses an ordinary photocathode as a photon/electron connecter in one end and a silicon semiconductor photodiode array on the other end.

Referring more specifically to FIG. 4, in operation, a light beam 124 from the lens or suitably disposed laser 122, is centered at the juncture 126 common to the four photodiodes 33. As the beam moves off center, it generates a signal to the leads 23 which is fed back to the controlling mechanism for an adjustment in the appropriate direction to recenter the beam 124.

Figure 5:
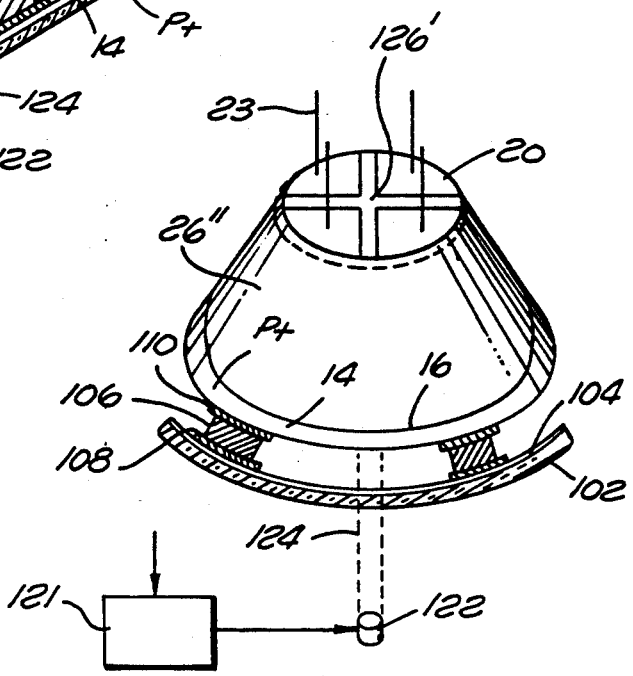
FIG. 5 is a schematic, perspective view of a quadrature array formed from the high-density silicon avalanche photodiode array of the embodiment of FIG. 3 connected to act in conjunction with a photomultiplier to form a hybrid, part solid state, Digicon, in accordance with another embodiment of this invention.

Referring to FIG. 5, a quadrature array is shown which functions in the same manner as the device of FIG. 1, but in which the array elements 20 are obtained from the avalanche photodiode array wafer 12 of FIG. 3. Four such elements 20 disposed in quadrature array are isolated and cut from the wafer 12 so as to be provided with bevelled surfaces 26'. Here, too, the device includes a p+region 14, but a common p-n junction 16. Analogous to the hybrid part solid state Digicon device in FIG. 3, the quadrature device uses an ordinary photocathode as a photon/electron connector on one end and a silicon avalanche photodiode array on the other end. In operation, analogous to the quadrature coarse array structure, a light beam 124 from a lens or semiconductor laser 122 is applied to the junction 126' centrally disposed between the four array elements 20. Signals obtained from the leads 23 are applied to the feedback mechanism 121 in the manner described with respect to the coarse quadrature array of FIG. 4.

It will be appreciated that the foregoing embodiments illustrate various applications of the silicon avalanche photodiode and photodiode array structure and that other applications and combinations are possible. It is understood that changes and variations can be made therein without departing from the scope of the invention or defined in the following claims.

What is claimed is:

1. An avalanche photodiode detector, comprising:
   photocathode means for receiving radiation and emitting photoelectrons:
   avalanche photodiode means comprising:
   a body of n-type silicon semiconductor material having phosphorous uniformly distributed therein obtained by neutron transmutation doping, whereby the resistivity is about 30-50 ohm-cm and throughout at least an active region varies less than plus or minus 0.5%,
   said body having first and second opposite surfaces, an edge surface, and a p-n junction between said first and second opposite surfaces,
   said second surface comprising an entrance surface, said edge surface being contoured such that then cross-sectional area of said body is decreased from said first to said second surface so that premature avalanche breakdown is prevented;
   signal contact means disposed on one of said first and second surfaces;

electrical contact means for reverse biasing said signal contact means;

means for obtaining a vacuum between said photocathode means and the entrance surface of said photodiode means; and means for applying a voltage between said photocathode means and said photodiode means whereby said photoelectrons are accelerated across said vacuum onto said entrance surface.

2. The avalanche photodiode detector of claim 1 in which said voltage applied between said photocathode means and said photodiode means is not more than 20 kilovolts.

3. The avalanche photodiode detector of claim 2 in which said voltage applied between said photocathode means and said photodiode means is not more than 10 kilovolts.

4. The avalanche photodiode detector of claim 3 in which said voltage applied between said photocathode means and said photodiode means is not more than 7.5 kilovolts.

5. The avalanche photodiode detector of claim 4 in which said voltage applied between said photocathode means and said photodiode means is not more than 5 kilovolts.

6. An avalanche photodiode detector comprising:

photocathode means for receiving radiation and emitting photoelectrons;

avalanche photodiode array means comprising:

a body of n-type silicon semiconductor material having phosphorous uniformly distributed therein obtained by neutron transmutation doping, whereby the resistivity is about 30-50 ohm and throughout at least an active region varies less than plus or minus 0.5%, said body having first and second opposite surfaces, an edge surface, and a p-n junction between said first and second opposite surfaces, said second surface comprising an entrance surface, said edge surface being contoured such that then cross-sectional area of said body is decreased at said first surface relative to said second surface whereby premature avalanche breakdown is prevented;

a plurality of signal contact forming an array disposed on one of said first and second surfaces.

electrical contact means for reverse biasing said signal contacts;

means for obtaining a vacuum between said photocathode means and the entrance surface of said array; and means for applying a voltage between said photocathode means and said photodiode array whereby said photoelectrons are accelerated across said vacuum onto said entrance surface.

7. The avalanche photodiode detector of claim 6 in which said voltage applied between said photocathode means and said photodiode array is not more than 20 kilovolts.

8. The avalanche photodiode detector of claim 7 in which said voltage applied between said photocathode means and said photodiode array is not more than 10 kilovolts.

9. The avalanche photodiode detector of claim 8 in which said voltage applied between said photocathode means and said photodiode array is not more than 7.5 kilovolts.

10. The avalanche photodiode detector of claim 9 in which said voltage applied between said photocathode means and said photodiode array is not more than 5 kilovolts.

11. The avalanche photodiode detector of claim 6 in which said avalanche array means is constituted by four integral photodiodes arranged in a quadrature array and defining a junction therebetween.

12. The avalanche photodiode detector of claim 6 which said avalanche photodiode array means is constituted by four integral but isolated photodiodes arranged in a quadrature array.

* * * * *